United States Patent
Koizumi et al.

(10) Patent No.: US 10,593,522 B2
(45) Date of Patent: Mar. 17, 2020

(54) ELECTROSTATIC CHUCK, PLACING TABLE AND PLASMA PROCESSING APPARATUS

(71) Applicant: TOKYO ELECTRON LIMITED, Tokyo (JP)

(72) Inventors: Katsuyuki Koizumi, Miyagi (JP); Dai Kitagawa, Miyagi (JP); Tomoyuki Takahashi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 838 days.

(21) Appl. No.: 14/690,802

(22) Filed: Apr. 20, 2015

(65) Prior Publication Data
US 2015/0311106 A1  Oct. 29, 2015

(30) Foreign Application Priority Data
Apr. 25, 2014  (JP) .................................. 2014-091504

(51) Int. Cl.
*H01J 37/32*  (2006.01)

(52) U.S. Cl.
CPC .. *H01J 37/32715* (2013.01); *H01J 37/32697* (2013.01)

(58) Field of Classification Search
CPC .......... H01J 37/32715; H01J 37/32697; H01L 21/6831
See application file for complete search history.

(56) References Cited

U.S. PATENT DOCUMENTS

| | | | | |
|---|---|---|---|---|
| 2002/0189940 A1* | 12/2002 | Tsai | ........................ | C23C 14/50 204/298.15 |
| 2004/0117977 A1* | 6/2004 | Hiramatsu | ........ | H01L 21/67103 29/611 |
| 2008/0102209 A1* | 5/2008 | Sasaki | ............... | H01L 21/67248 427/294 |
| 2009/0086400 A1* | 4/2009 | Samir | ................. | H01L 21/6833 361/234 |

FOREIGN PATENT DOCUMENTS

| | | |
|---|---|---|
| JP | 2002-237375 A | 8/2002 |
| JP | 2012-212735 A | 11/2012 |
| TW | 200914218 A | 4/2009 |

OTHER PUBLICATIONS

Elaine J. Hom, Jun. 24, 2013, Livescience.*

* cited by examiner

*Primary Examiner* — Kambiz Zand
*Assistant Examiner* — Mirza Israr Javed
(74) *Attorney, Agent, or Firm* — Rothwell, Figg, Ernst & Manbeck, P.C.

(57) ABSTRACT

Disclosed is an electrostatic chuck including a circular placing region configured to place a processing target object thereon. The placing region includes a bottom surface and a plurality of protrusions configured to protrude from the bottom surface. Further, the plurality of protrusions is formed at a plurality of positions set at a regular interval on each of a plurality of circles set concentrically and at a regular interval around a center of the placing region. Furthermore, among the plurality of positions, a plurality of positions set on each of any two adjacent circles is set not to be positioned on the same straight line extending from the center.

8 Claims, 4 Drawing Sheets

ELECTROSTATIC CHUCK, PLACING TABLE AND PLASMA PROCESSING APPARATUS

CROSS-REFERENCE TO RELATED APPLICATIONS

This application is based on and claims priority from Japanese Patent Application No. 2014-091504, filed on Apr. 25, 2014, with the Japan Patent Office, the disclosure of which is incorporated herein in its entirety by reference.

TECHNICAL FIELD

The present disclosure relates to an electrostatic chuck, a placing table, and a plasma processing apparatus.

BACKGROUND

In manufacturing an electronic device such as, for example, a semiconductor device, various processings are performed on a processing target object such as a semiconductor substrate. A plasma processing such as a plasma etching may be exemplified as a processing for the processing target object. A plasma processing apparatus for performing the plasma processing includes an electrostatic chuck that attracts the processing target object by an electrostatic force within a processing container.

As described in the Japanese Patent Laid-Open Publication No. 2012-212735, the electrostatic chuck includes an electrode for electrostatic attraction as an inner layer within a dielectric body. Further, a surface of the electrostatic chuck, i.e., the placing region of a processing target object includes a plurality of protrusions. The plurality of protrusions is generally arranged at grid points. In such an electrostatic chuck, the processing target object is placed on the electrostatic chuck to be in contact with top surfaces of the protrusions.

SUMMARY

In an aspect of the present disclosure, there is provided an electrostatic chuck. The electrostatic chuck includes a circular placing region configured to place a processing target object thereon. The placing region includes a bottom surface; and a plurality of protrusions configured to protrude from the bottom surface. The plurality of protrusions is formed at a plurality of positions set at a regular interval on each of a plurality of circles set concentrically and at a regular interval around a center of the placing region. Furthermore, among the plurality of positions, a plurality of positions set on each of any two adjacent circles (circumferences) is set not to be positioned on the same straight line extending from the center.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
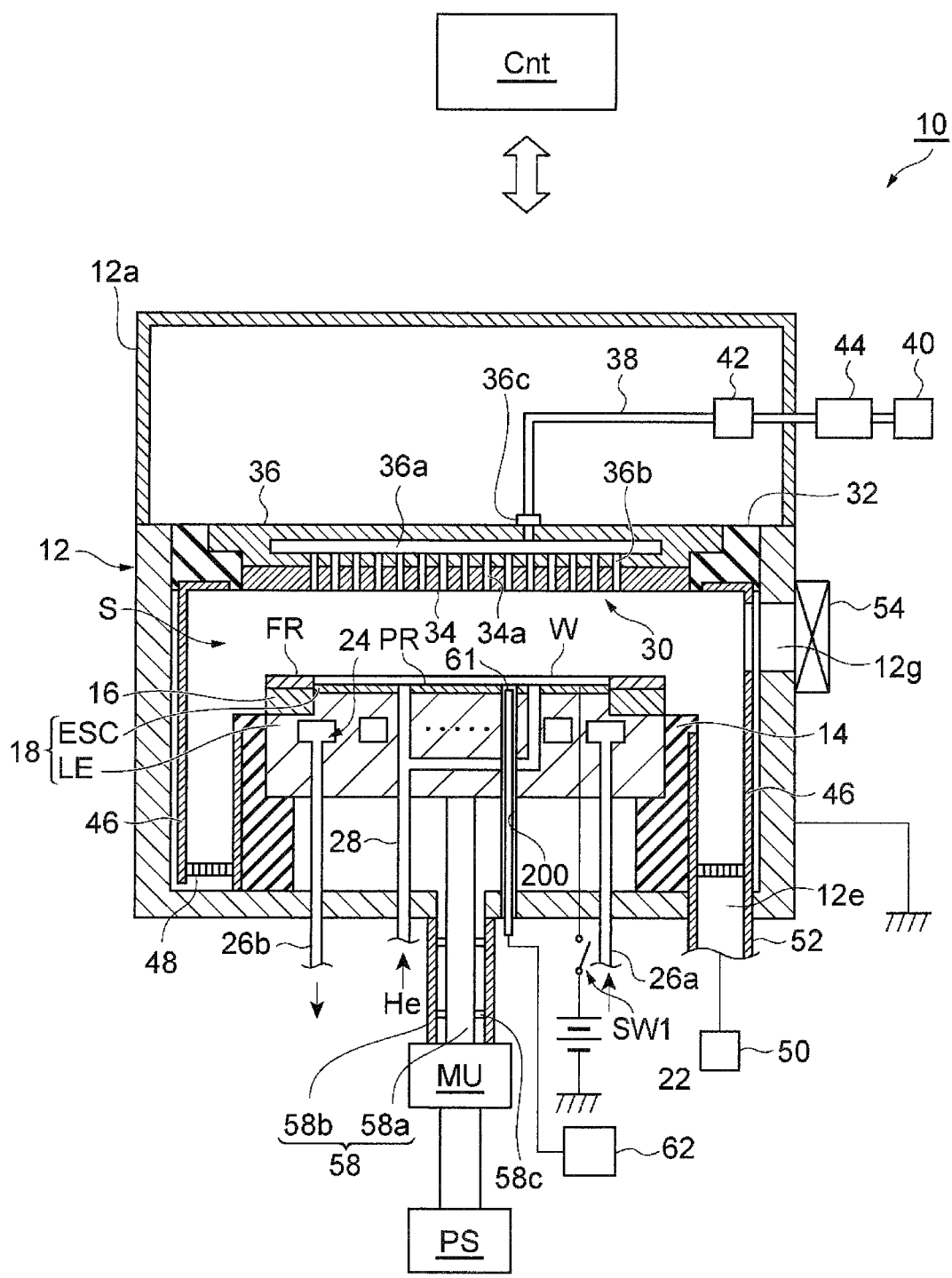
FIG. 1 is a view schematically illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a placing table of a plasma processing apparatus including an electrostatic chuck, a temperature control unit is provided to control the temperature of a processing target object. In such a placing table, the plurality of protrusions of the electrostatic chuck is in contact with the processing target object to form a plurality of thermal transfer paths.

Further, a plurality of chips is formed simultaneously in the processing target object. That is, the processing target object may include a plurality of chip forming regions having a substantially rectangular shape. In order to process the plurality of chip forming regions in the same manner, it is necessary to reduce the non-uniformity of temperature during the processing of the chip forming regions. To this end, it is necessary to reduce the non-uniformity of the number of protrusions which are contact with the plurality of chip forming regions, respectively.

In an aspect, there is provided an electrostatic chuck. The electrostatic chuck includes a circular placing region for placing the processing target object. The placing region includes a bottom surface and a plurality of protrusions protruding from the bottom surface. The plurality of protrusions is formed at a plurality of positions set at regular intervals on each of a plurality of circles (circumferences) which is set concentrically and at a regular interval around the center of the placing region.

When the plurality of protrusions is arranged in a grid pattern, that is, when the protrusions are arranged on grid lines, the number of grid lines positioned under each of the plurality of chip forming regions may be different from each other so that the number of protrusions which are in contact with each of the plurality of chip forming regions may be different from each other. On the other hand, in the electrostatic chuck according to an aspect of the present disclosure, the plurality of protrusions is not arranged in a grid pattern. That is, the positions where the plurality of protrusions is formed are set at a regular interval on each of the plurality of concentric circles (i.e., circumference of each of the plurality of concentric circles). Further, among the positions, a plurality of positions set on each circumference of any two adjacent circles is set in order not to be positioned on the same straight line extending from the center of the placing region. Since the plurality of protrusions is formed at such set positions above, in the electrostatic chuck according to an aspect of the present disclosure, it is possible to reduce the non-uniformity of the number of the protrusions which are in contact with each of the plurality of the chip forming regions.

In an exemplary embodiment, the placing region may further include a protrusion arranged at the center.

In an exemplary embodiment, another position among the plurality of positions may be set at an intersection point between a straight line extending from the center and an outer circle of any two adjacent circles among the plurality of circles except for the innermost circle, wherein the straight line extends from the center at a predetermined angle to another straight line extending from the center to pass through a position among the plurality of positions set on an inner circle of the two adjacent circles. In an exemplary embodiment, the predetermined angle may be 1.6 degrees. Further, in an exemplary embodiment, the number of protrusions formed on the outer circle may be larger than the number of protrusions formed on the inner circle by six.

In another aspect, there is provided a placing table including the aspect or any one of various exemplary embodiments described above. The placing table includes, in addition to the electrostatic chuck, three lifter pins which are able to moving within three through holes formed in the electrostatic chuck. The three lifter pins are provided to adjust the distance between the electrostatic chuck and the processing target object. That is, when the processing target object is loaded, the three lifter pins receive it above the electrostatic chuck, and then are lowered to arrange the received processing target object on the plurality of protrusions. Meanwhile, when the processing target object is unloaded, the three lifter pins are lifted to move it above the electrostatic chuck.

In the placing table according to an exemplary embodiment among the various exemplary embodiment described above, the electrostatic chuck may be set such that the number of protrusions formed on one circle is larger than the number of protrusions formed on the other circle by six. According to this exemplary embodiment, the three through holes can be formed at a regular interval in a circumferential direction so that they may not interfere with the plurality of protrusions.

In still another aspect, there is provided a plasma processing apparatus. The plasma processing apparatus includes a processing container and the placing table described above. According to the plasma processing apparatus, it is possible to reduce the non-uniformity of processing on the plurality of the chip forming regions.

As described above, it is possible to reduce the non-uniformity of the number of the protrusions of the electrostatic chuck which are positioned below each of the plurality of chip forming regions of the processing target object.

Hereinafter, exemplary embodiments of the present disclosure will be described in detail with reference to the accompanying drawings. In the following description, same elements or elements having the same function are given the same reference numerals.

FIG. 1 is a view schematically illustrating a plasma processing apparatus according to an exemplary embodiment. A vertical cross-sectional structure of a plasma processing apparatus 10 is schematically illustrated in FIG. 1. The plasma processing apparatus 10 illustrated in FIG. 1 is a capacitively coupled parallel plate plasma etching apparatus, and includes a substantially cylindrical processing container 12. The inner wall surface of the processing container 12 is made of, for example, anodized aluminum.

A substantially cylindrical support 14 made of an insulating material is provided on a bottom portion of the processing container 12. The support 14 extends vertically from the bottom portion of the processing container 12 within the processing container 12. The support 14 supports a placing table 18 provided within the processing container 12. Specifically, as illustrated in FIG. 1, the support 14 may support the placing table 18 on the inner wall surface thereof.

The placing table 18 includes a base LE and an electrostatic chuck ESC. The base LE is made of a metal such as, for example, aluminum, and is formed substantially in a disk shape. The base is configured as a lower electrode. The electrostatic chuck ESC is provided on the base LE. As will be described in more detail below, the electrostatic chuck ESC has a structure in which an electrode is provided as a conductive film between a pair of insulation layers or insulation sheets. A direct current ("DC") power supply 22 is electrically connected to the electrode of the electrostatic chuck ESC via a switch SW1. The electrostatic chuck ESC attracts the processing target object (hereinafter, referred to as a "wafer W") by an electrostatic force such as a Coulomb force generated by a DC voltage from the DC power supply 22.

A spacer unit 16 made of an insulator is formed on the peripheral portion of the base LE of the placing table 18. A focus ring FR is disposed on the spacer unit 16 to surround the peripheral edge of the wafer W and the electrostatic chuck ESC. The focus ring FR is provided to improve the uniformity of the plasma processing. The focus ring FR is made of a material properly selected according to the plasma processing to be performed, and may be made of, for example, quartz.

A flow path 24 for a heat exchange medium such as, for example, coolant, is formed within the base LE. The heat exchange medium is supplied to the flow path 24 through a pipe 26a from a chiller unit provided at the outside. The heat exchange medium supplied to the flow path 24 returns to the chiller unit through a pipe 26b. The temperature of the wafer W supported on the placing table 18 is controlled by controlling the temperature of the heat exchange medium which is circulated as described above.

Further, a gas supply line 28 is provided in the plasma processing apparatus 10. The gas supply line 28 supplies a heat transfer gas, e.g., He gas, from a heat transfer gas supply mechanism to a gap between the top surface of the electrostatic chuck ESC and the rear surface of the wafer W.

Figure 3:
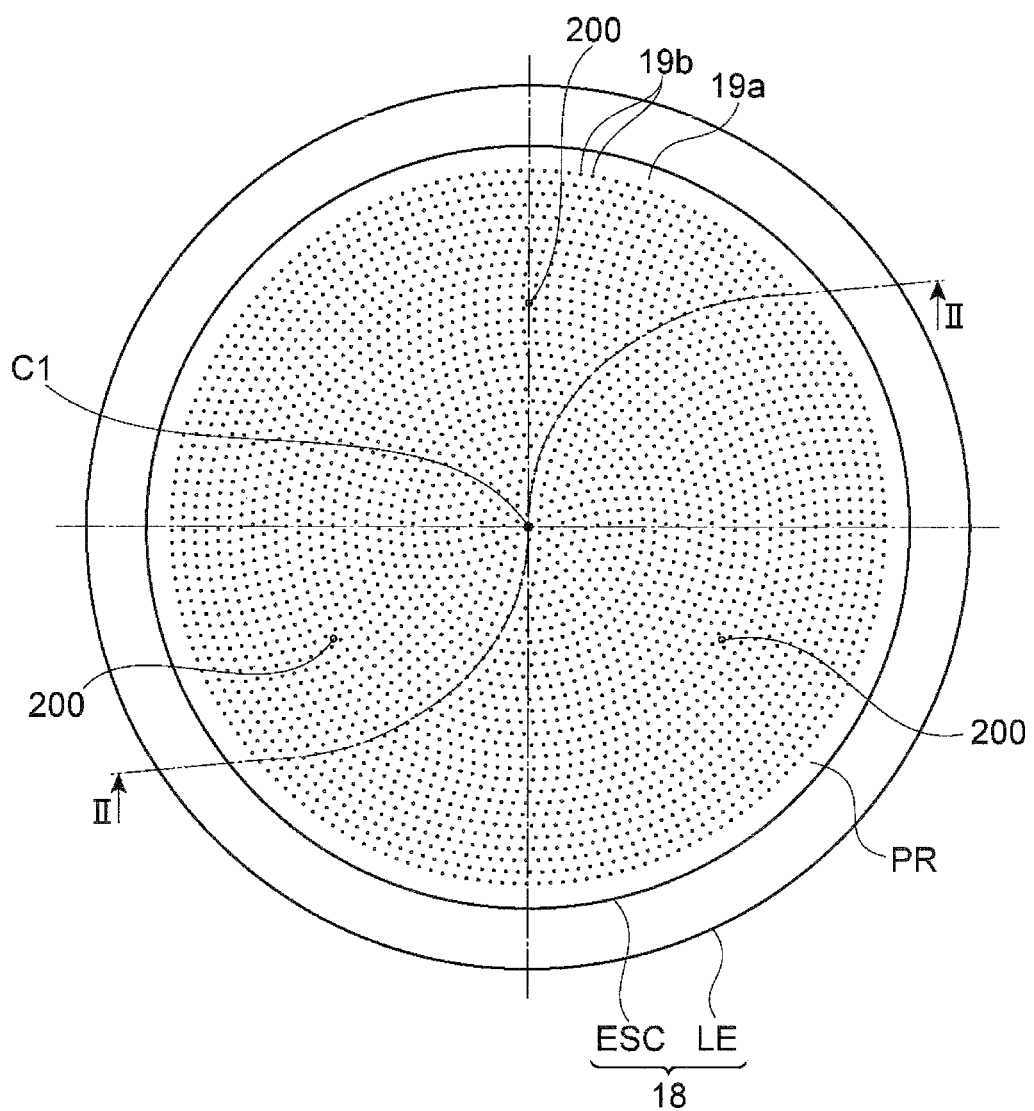
FIG. 3 is a plane view illustrating the placing table of the plasma processing apparatus illustrated in FIG. 1.

In the placing table 18 of an exemplary embodiment, three through holes 200 for lifter pins are formed. Only one of the through holes 200 for lifter pins is illustrated in FIG. 1. As illustrated in FIG. 3, the three through holes 200 are formed to pass through three positions spaced apart from each other at a regular interval on a circle having its center located at the center C1 of the placing region PR which will be described below. Further, lifter pins 61 are movably provided within the through holes 200, respectively. The lifter pins 61 are connected to a driving mechanism 62, and vertically moved by the driving mechanism 62.

The plasma processing apparatus 10 further includes an upper electrode 30. The upper electrode 30 is disposed above the placing table 18 to face the placing table 18. The upper electrode 30 and the base LE are formed substantially in parallel to each other.

The upper electrode 30 is supported on the top of the processing container 12 through an insulating shielding member 32. The upper electrode 30 may include an electrode plate 34 and an electrode support 36. The electrode plate 34 faces the processing space S, and defines a plurality of gas ejecting holes 34a. The electrode plate 34 may be made of a low resistance conductor generating little Joule heat or a semiconductor.

The electrode support 36 is configured to detachably support the electrode plate 34, and may be made of a conductive material such as, for example, aluminum. The electrode support 36 may have a water cooling structure. A gas diffusion container 36a is provided within the electrode support 36. A plurality of gas passage holes 36b extends downwardly from the gas diffusion container 36a to communicate with the gas ejecting holes 34a. A gas introducing port 36c is formed in the electrode support 36 to introduce a processing gas into the gas diffusion container 36a, and a gas supply pipe 38 is connected to the gas introducing port 36c. A gas source group 40 is connected to the gas supply pipe 38 via a valve group 42 and a flow rate controller group 44.

The valve group 42 includes a plurality of opening/closing valves, and the flow rate controller group 44 includes a plurality of flow rate controllers such as mass flow controllers. Further, the gas source group 40 includes a plurality of gas sources for a plurality of species of gases. The plurality of gas sources of the gas source group 40 is connected to a gas supply line 38 via corresponding opening/closing valves and mass flow controllers, respectively.

The plasma processing apparatus 10 may further include a ground conductor 12a. The ground conductor 12a is formed in a substantially cylindrical shape, and is provided to extend from the side wall of the processing container 12 to a higher position than the height position of the upper electrode 30.

In the plasma processing apparatus 10, a deposition shield 46 is detachably formed along the inner wall of the processing container 12. The deposition shield 46 is also formed on the outer periphery of the support 14. The deposition shield 46 is configured to prevent etching by-products (deposits) from being attached on the processing container 12, and may be formed by coating a ceramic such as, for example, $Y_2O_3$, on an aluminum material.

At the bottom side of the processing container 12, an exhaust plate 48 is provided between the support 14 and the inner wall of the processing container 12. The exhaust plate 48 may be formed by coating a ceramic such as, for example, $Y_2O_3$, on an aluminum material. An exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump, and may decompress the inside of the processing container 12 to a desired vacuum degree. A carry-in/out port 12g of the wafer W is formed on the side wall of the processing container 12. The carry-in/out port 12g is configured to be capable of being opened/closed by a gate valve 54.

The plasma processing apparatus 10 further includes a power feeding rod 58 configured to supply a high frequency power to the base LE. The power feeding rod 58 has a coaxial double tube structure, and includes a rod-shaped conductive member 58a and a tubular conductive member 58b. The rod-shaped conductive member 58a extends substantially vertically from the outside of the processing container 12 to the inside of the processing container 12 through the bottom of the processing container 12, and the upper end of the rod-shaped conductive member 58a is connected to the base LE. The tubular conductive member 58b is provided coaxially with respect to the rod-shaped conductive member 58a to surround the periphery of the rod-shaped conductive member 58a, and is supported on the bottom of the processing container 12. Two substantially annular insulating members 58c are interposed between the rod-shaped conductive member 58a and the tubular conductive member 58b to electrically insulate the rod-shaped conductive member 58a and the tubular conductive member 58b from each other.

The plasma processing apparatus 10 may further include a matching unit MU. The matching unit MU is connected to the lower ends of the rod-shaped conductive member 58a and the tubular conductive member 58b. A power system PS is connected to the matching unit MU. The power system PS is configured to supply two different high frequency powers to the base LE. One of the two different high frequency powers is a high-frequency power for plasma generation, and has a frequency in a range of 27 MHz to 100 MHz, for example. Further, the other of the two different high frequency powers is a high-frequency bias power for drawing-in of ions, and has a frequency in a range of 40 kHz to 13.56 MHz, for example. The high-frequency power for plasma generation may be supplied to the upper electrode 30.

The plasma processing apparatus 10 may further include a control unit Cnt. The control unit Cnt is, for example, a computer provided with a processor, a storage unit, an input device, and a display device. The plasma processing apparatus controls respective components thereof, for example, a power supply system, a gas supply system, a driving system, and the power system PS. With the control unit Cnt, an operator may perform, for example, an input operation of a command through the input device in order to manage the plasma processing apparatus 10, and the display device may visually display the driving situation of the plasma processing apparatus 10. The storage unit of the control unit Cnt is stored with a control program that allows the processor to control respective processings executed in the plasma processing apparatus 10, or a program that causes respective components of the plasma processing apparatus 10 to execute the processings according to processing conditions, that is, a processing recipe.

Figure 2:
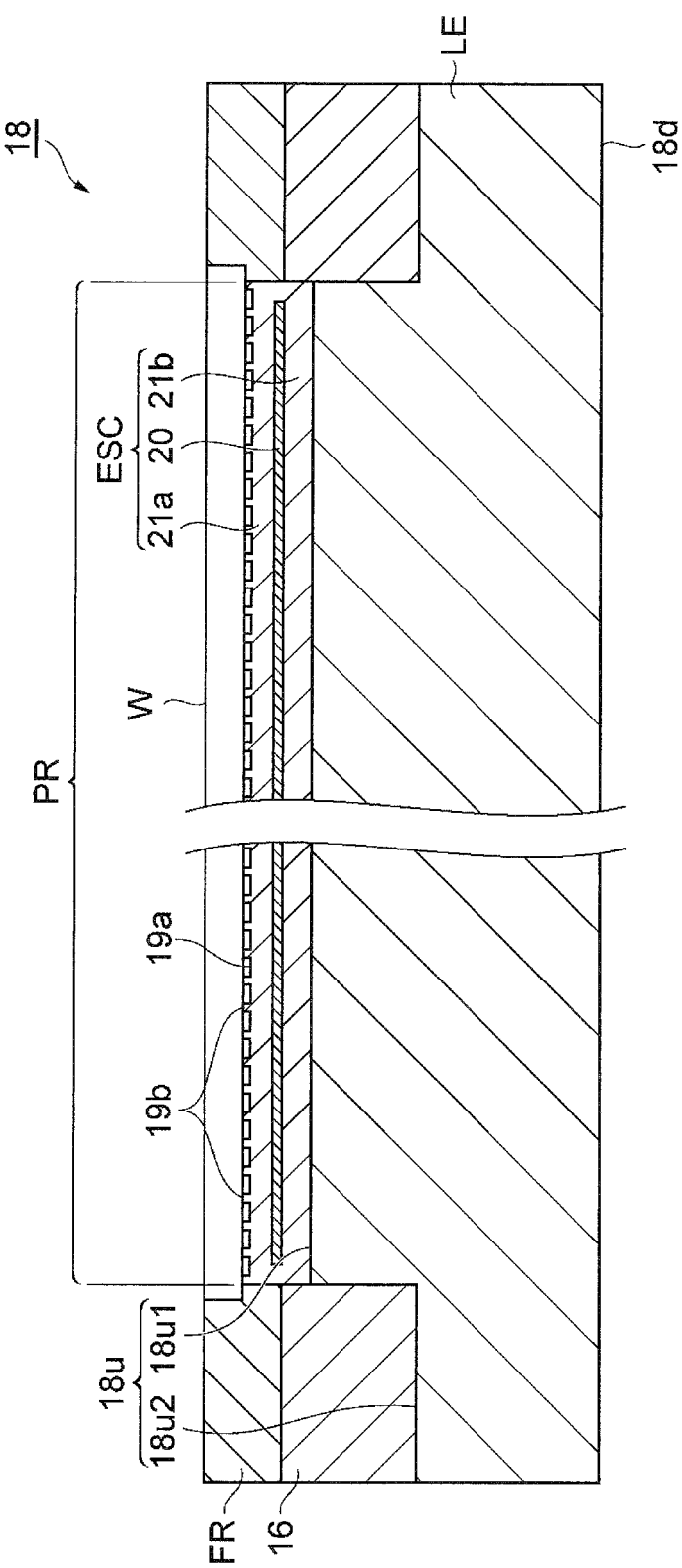
FIG. 2 is a cross-sectional view illustrating a placing table of the plasma processing apparatus illustrated in FIG. 1.
Figure 4:
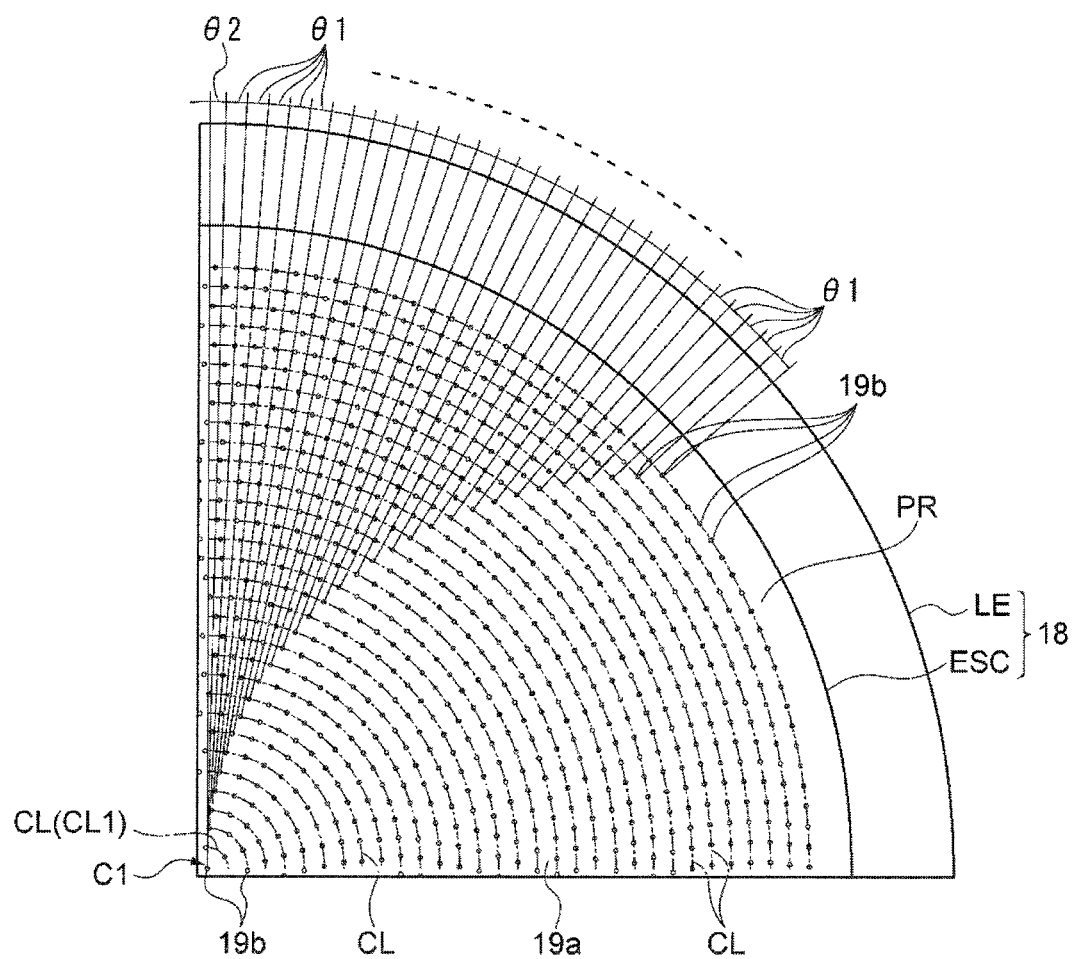
FIG. 4 is a plane view illustrating a part of FIG. 3 in an enlarged scale.

Hereinafter, detailed descriptions will be made on a placing table 18 of the plasma processing apparatus 10 with reference to FIGS. 2 to 4. FIG. 2 is a cross-sectional view illustrating a placing table of the plasma processing apparatus illustrated in FIG. 1. FIG. 3 is a plane view illustrating the placing table of the plasma processing apparatus illustrated in FIG. 1. FIG. 4 is a plane view illustrating a part of FIG. 3 in an enlarged scale. FIG. 2 illustrates a cross section of the placing table taken approximately along line II-II of FIG. 3 in which the flow path 24 is omitted.

As illustrated in FIG. 2, the base LE has a substantially circular shape and includes a bottom surface 18d and a top surface 18u. The bottom surface 18d is a substantially flat surface, and the top surface 18u includes a first top surface 18u1 and a second top surface 18u2. The first top surface 18u1 is a circular surface, and is located inside the second top surface 18u2. The second top surface 18u2 extends annularly in the outside of the first top surface 18u1. The second top surface 18u2 is provided at a lower position than the first top surface 18u1. That is, the distance between the second top surface 18u2 and the bottom surface 18d is shorter than the distance between the first top surface 18u1 and the bottom surface 18d.

The electrostatic chuck ESC is provided on the first top surface 18u1 of base LE. The electrostatic chuck ESC includes a pair of insulation films 21a and 21b, and an electrode 20 interposed between the insulation films 21a and 21b. The electrostatic chuck ESC includes a placing region PR on which a wafer W is placed. The placing region PR is a circular region when viewed from the top, and is configured as a surface of a processing space S side. The placing region PR has a diameter which is substantially the same as or slightly smaller than that of the wafer W.

The placing region PR includes a bottom surface 19a and a plurality of protrusions 19b. The bottom surface 19a extends along a plane which is substantially perpendicular to a vertical direction. The plurality of protrusions 19*b* protrudes upwardly from the bottom surface 19*a* and is distributed in the placing region PR. The plurality of protrusions 19*b* has a substantially columnar shape. The top surfaces of the plurality of protrusions 19*b* are configured as a top surface of the electrostatic chuck ESC. Therefore, when the wafer W is placed on the placing table 18, the wafer W comes in contact with the top surfaces of the plurality of protrusions 19*b*. Further, the distance between the top surfaces of the plurality of protrusions 19*b* and the bottom surface 19*a* ranges from 10 µm to 50 µm, for example. The ratio occupied by the area of the top surfaces of the plurality of protrusions 19*b* in the total area of the bottom surface 19*a* and the plurality of protrusions 19*b* ranges from, for example, 5% to 40%.

As illustrated in FIGS. 3 and 4, one protrusion 19*b* is formed at the center of the placing region PR. Further, the plurality of protrusions 19*b* is formed at a plurality of positions set at a regular interval on the entire circumference of each of a plurality of circles CL that is set concentrically and at a regular interval around a center C1 of the placing region PR. The plurality of circles CL is set such that a gap between the center C1 and the innermost circle CL1 and a gap between any two adjacent circles is, for example, 4.5 mm. Further, the plurality of positions, which is set on each of the circumferences of any two adjacent circles CL, is set not to be positioned on the same straight line extending from the center C1. Among the plurality of positions, a plurality of positions set on each of any two adjacent circles is set not to be positioned on the same straight line extending from the center C1.

In an exemplary embodiment, another position among the plurality of positions is set at an intersection point between a straight line extending from the center C1 and the outer circle of any two adjacent circles among the plurality of circles CL except for the innermost circle CL1, in which the straight line extends from the center C1 at a predetermined angle θ1 to another straight line extending from the center C1 to pass through one position among the plurality of positions set on the inner circle of the two adjacent circles. That is, when two straight lines, which extend from the center C1 and form a predetermined angle θ1 therebetween, are assumed, a position, on which one of the plurality of protrusions 19*b* is formed, is set at an intersection point between one of the two adjacent circles and one of the two straight lines, and another position, on which another of the plurality of protrusions 19*b* is formed, is set at an intersection point between the other of the two adjacent circles and the other of the two straight lines. The predetermined angle θ1 is, e.g., 1.6 degrees.

Further, in an exemplary embodiment, another position among a plurality of positions is set at an intersection point between a straight line extending from the center C1 and a circle CL adjacent to the innermost circle CL1, in which the straight line extends from the center C1 at a predetermined angle θ2 to another straight line extending from the center C1 to pass through one position among a plurality of positions set on the innermost circle CL1. That is, when two straight lines, which extend from the center C1 and form a predetermined angle θ2 therebetween, a position, on which one of the plurality of protrusions 19*b* is formed, is set at an intersection point between the circle CL1 and one of the two straight lines, and another position, on which another of the plurality of protrusions 19*b* is formed, is set at an intersection point between the circle CL adjacent to the circle CL1 and the other of the two straight lines. The predetermined angle θ2 may be different from the predetermined angle θ1. The predetermined angle θ2 is, e.g., 1.2 degrees.

Further, in an exemplary embodiment, the number of protrusions 19*b* formed on the plurality of circles CL is a multiple of six. The number of protrusions formed on the outer circle of any two adjacent circles CL is set to be larger than the number of protrusions formed on the inner circle of the two adjacent circles CL by six. For example, the number of protrusions 19*b* formed on the innermost circle CL1 is 6, and the number of protrusions 19*b* formed on the outer circle CL adjacent to the circle CL1 is 12. By providing the protrusions 19*b* on the circles CL as described above, through holes 200 for lifter pins may be formed not to interfere with the protrusions 19*b*.

Here, a conventional electrostatic chuck will be considered. In the conventional electrostatic chuck, a plurality of protrusions is arranged in a grid pattern. That is, the protrusions are arranged on grid lines in the conventional electrostatic chuck. In such a conventional electrostatic chuck, the number of grid lines positioned under each of a plurality of substantially rectangular chip forming regions of a wafer W may be different from that of grid lines positioned under any other chip forming region so that the number of protrusions which are in contact with each of the plurality of chip forming regions may be different from that of protrusions which are in contact with any other chip forming region.

On the other hand, in the electrostatic chuck ESC according to an exemplary embodiment, the plurality of protrusions 19*b* is not arranged in a grid pattern. That is, in the electrostatic chuck ESC, the plurality of protrusions 19*b* is arranged at regular intervals on a plurality of circles set at regular intervals, and is arranged not to be positioned on the same diameter extending from the center C1 of the placing region PR on any two adjacent and concentric circles CL. In other words, in the electrostatic chuck ESC, the plurality of protrusions 19*b* of the electrostatic chuck are formed at a plurality of positions, which is set at intersection points between a plurality of circles CL sharing the center C1 and set at regular intervals and a plurality of curves extending from the center C1 of the placing region PR. Further, the plurality of positions is set at regular intervals on all the circles CL. With the electrostatic chuck ESC, non-uniformity in the number of protrusions which are in contact with each of the plurality of the chip forming regions of the wafer W may be reduced. Accordingly, with the placing table 18 including the electrostatic chuck ESC, a difference in temperature between the plurality of chip forming regions may be reduced when a plasma processing is performed on the plurality of chip forming regions of the wafer W. With the plasma processing apparatus 10 including the placing table 18, non-uniformity in processing on the plurality of the chip forming regions of the wafer W may be reduced.

Although some exemplary embodiments are described above, various modified exemplary embodiments may be implemented without limiting to the above exemplary embodiments. For example, in the exemplary embodiments described above, the plasma processing apparatus is a capacitively coupled plasma processing apparatus, but the plasma processing apparatus which may employ the placing table 18 including the electrostatic chuck ESC is not limited to the capacitively coupled plasma processing apparatus. For example, the placing table 18 may be employed in a plasma processing apparatus using any plasma source such as an inductively coupled plasma processing apparatus and a plasma processing apparatus using a surface wave such as, for example, a microwave as the plasma source.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electrostatic chuck comprising:
a circular placing region configured to place a processing target object thereon,
wherein the placing region includes:
a bottom surface; and
a plurality of protrusions protruding from the bottom surface,
wherein the plurality of protrusions are formed at a plurality of positions on each of a plurality of circles set concentrically and at a first regular interval around a center of the placing region, and
wherein (i) a first plurality of protrusions among the plurality of protrusions are formed at a first plurality of positions among the plurality of positions along a first circle among the plurality of circles with a second regular circumferential interval, (ii) a second plurality of protrusions among the plurality of protrusions are formed at a second plurality of positions among the plurality of positions along a second circle among the plurality of circles with the second regular circumferential interval, and (iii) a third plurality of protrusions among the plurality of protrusions are formed at a third plurality of positions among the plurality of positions along a third circle among the plurality of circles with the second regular circumferential interval, the second circle being adjacent to the first circle and the third circle being adjacent to the second circle, and among the plurality of positions, a plurality of positions set on each of the first, second and third circles are set not to be positioned on a same straight line extending from the center, and
wherein the plurality of positions of the plurality of protrusions are set at intersection points between the plurality of circles and a plurality of curves extending from the center of the placing region.

2. The electrostatic chuck of claim 1, wherein the placing region further includes a protrusion arranged at the center.

3. The electrostatic chuck of claim 1, wherein another position among the plurality of positions is set at an intersection point between a straight line extending from the center and an outer circle of any three adjacent circles among the plurality of circles, except for the innermost circle, wherein the straight line extends from the center at a predetermined angle to another straight line extending from the center to pass through a position among the plurality of positions set on an inner circle of the three adjacent circles.

4. The electrostatic chuck of claim 3, wherein the predetermined angle is 1.6 degrees.

5. The electrostatic chuck of claim 3, wherein the number of protrusions formed on the outer circle is larger than the number of protrusions formed on the inner circle by six.

6. A placing table comprising: the electrostatic chuck of claim 1 which includes three through holes formed to pass through the placing region: and three lifter pins configured to be movable within the three through holes.

7. The placing table of claim 6, wherein the electrostatic chuck is the electrostatic chuck of claim 5.

8. A plasma processing apparatus comprising: a processing container; and the placing table of claim 6 which is provided within the processing container.

* * * * *